US012663901B2

(12) United States Patent     (10) Patent No.:   US 12,663,901 B2

Chen et al.     (45) Date of Patent:    Jun. 23, 2026

(54) TOUCH FILM, TOUCHSCREEN, AND ELECTRONIC DEVICE

(71) Applicant: HUAWEI TECHNOLOGIES CO., LTD., Shenzhen (CN)

(72) Inventors: Zesheng Chen, Dongguan (CN); Junyong Zhang, Dongguan (CN); Yao Wang, Dongguan (CN); Tao Tang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/700,888

(22) PCT Filed: Oct. 28, 2023

(86) PCT No.: PCT/CN2023/127431
§ 371 (c)(1),
(2) Date: Apr. 12, 2024

(87) PCT Pub. No.: WO2024/114203
PCT Pub. Date: Jun. 6, 2024

(65) Prior Publication Data
US 2025/0278156 A1    Sep. 4, 2025

(30) Foreign Application Priority Data
Nov. 29, 2022   (CN) .......................... 202211506848.2

(51) Int. Cl.
*G06F 3/044*      (2006.01)
*G06F 3/041*      (2006.01)
(Continued)

(52) U.S. Cl.
CPC .......... *G06F 3/0446* (2019.05); *G06F 3/0412* (2013.01); *G06F 3/0445* (2019.05);
(Continued)

(58) Field of Classification Search
CPC .... G06F 3/0446; G06F 3/0412; G06F 3/0445; G06F 2203/04102; G06F 2203/04111;
(Continued)

(56) References Cited

U.S. PATENT DOCUMENTS

| | | | |
|---|---|---|---|
| 2008/0165139 A1* | 7/2008 | Hotelling .............. | G06F 3/0447 |
| | | | 345/173 |
| 2010/0045615 A1* | 2/2010 | Gray ..................... | G06F 3/0443 |
| | | | 345/173 |

(Continued)

FOREIGN PATENT DOCUMENTS

| | | |
|---|---|---|
| CN | 108089760 A | 5/2018 |
| CN | 115268698 A | 11/2022 |

(Continued)

OTHER PUBLICATIONS

International Search Report and Written Opinion in International Appln. No. PCT/CN2023/127431, mailed on Jan. 15, 2024, 10 pages (with partial English translation).

*Primary Examiner* — Patrick N Edouard
*Assistant Examiner* — Joseph P Fox
(74) *Attorney, Agent, or Firm* — Fish & Richardson P.C.

(57) ABSTRACT

A touch film, a touchscreen, and an electronic device are provided. The touch film includes a touch electrode layer and a dielectric isolation layer. The touch electrode layer includes metal lines arranged in a cross manner to form mesh units. Fractures configured to divide the metal lines into a transmit electrode and a receive electrode are provided on the metal lines, and the transmit electrode and the receive electrode form a touch capacitor structure at each of the fractures. Each of two ends of the fracture in a first direction is adjacent to two sides of at least one of the mesh units, to electrically isolate mesh units on two sides.

19 Claims, 12 Drawing Sheets

(51) Int. Cl.
    *H04M 1/02*         (2006.01)
    *H10K 59/40*       (2023.01)

(52) U.S. Cl.
    CPC ....... *H04M 1/0214* (2013.01); *H04M 1/0268* (2013.01); *H10K 59/40* (2023.02); *G06F 2203/04102* (2013.01); *G06F 2203/04111* (2013.01); *G06F 2203/04112* (2013.01); *H04M 2201/38* (2013.01)

(58) Field of Classification Search
    CPC ....... G06F 2203/04112; H04M 1/0214; H04M 1/0268; H04M 2201/38; H10K 59/40
    See application file for complete search history.

(56)            References Cited

U.S. PATENT DOCUMENTS

| | | | |
|---|---|---|---|
| 2013/0082970 A1* | 4/2013 | Frey ........................ | H01H 65/00 |
| | | | 345/173 |
| 2022/0308694 A1* | 9/2022 | Tong .................... | H10K 59/122 |
| 2025/0231648 A1* | 7/2025 | Yan ........................ | G06F 3/0412 |

FOREIGN PATENT DOCUMENTS

| | | | | |
|---|---|---|---|---|
| KR | 20150135565 | A | 12/2015 | |
| KR | 101653719 | B1 * | 9/2016 | ............. G06F 3/041 |

\* cited by examiner

-- Prior Art --

TOUCH FILM, TOUCHSCREEN, AND ELECTRONIC DEVICE

CROSS-REFERENCE TO RELATED APPLICATIONS

This application is a national stage of International Application No. PCT/CN2023/127431, filed on Oct. 28, 2023, which claims priority to Chinese Patent application Ser. No. 202211506848.2, filed on Nov. 29, 2022. The disclosures of aforementioned applications are incorporated herein by reference in their entireties.

This application claims priority to Chinese Patent Application No. 202211506848.2, filed with the China National Intellectual Property Administration on Nov. 29, 2022, and entitled "TOUCH FILM, TOUCHSCREEN, AND ELECTRONIC DEVICE", which is incorporated herein by reference in its entirety.

TECHNICAL FIELD

This application relates to the field of display touchscreen technologies, and in particular, to a touch film, a touchscreen, and an electronic device.

BACKGROUND

Touch is currently a main medium for human-machine interaction. With development of touch technologies and people's requirements for higher product effect, the touch technologies develop toward a direction of lightness, thinness, and high integration.

With development of display technologies, increasingly more screen forms, such as a curved screen, a waterfall screen, a foldable screen, and a stretchable screen, appear in the public life. A mobile phone is used as an example. With continuous innovation and expansion of mobile phone forms, foldable mobile phone products have formed a high value-added product series. Folding forms include inward folding and outward folding. In an early stage of development of a foldable product, a touch solution of an add-on ultra-thin film layer is mainly used. With development of integrated touch technologies, mainstream touch solutions at present all use a current thin film packaging integrated touch solution with a relatively high integration degree.

The thin film packaging integrated touch solution is a solution in which a touch function layer is directly integrated on a flexible display panel by directly performing process steps such as thin film deposition, photoetching, and dry etching on a flexible display thin film (for example, an OLED thin film) packaging layer, and has advantages such as low costs, high integration, lightness, and thinness. Because touch electrodes are formed on one layer of metal, physical isolation between a transmit electrode (TX) and a receive electrode (RX) needs to be formed on the same layer by using fractures. However, as shown in FIG. 4, an existing fracture solution is to break at a middle position of a metal mesh formed around pixels. However, in a folding reliability test, it is found that a large stress concentration exists in the fracture at the position. Consequently, a dielectric isolation layer of a touchscreen fractures due to the stress concentration, resulting in a failure of a touch function and the screen.

SUMMARY

This application provides a touch film, a touchscreen, and an electronic device. Each fracture of a touch electrode layer is supported by at least two sides of a mesh unit. When the touch film is subject to an external pressing force or is bent, a stress value at a position of the fracture is correspondingly reduced, and a dielectric isolation layer filled in the fracture is not prone to be deformed due to a reduced stress. This improves structural strength of the touch film.

According to a first aspect, this application provides a touch film, including a touch electrode layer and a dielectric isolation layer. The touch electrode layer is located in the dielectric isolation layer. The touch electrode layer includes a plurality of metal lines, and the plurality of metal lines are arranged in a cross manner to form a plurality of polygonal mesh units. A plurality of fractures are provided on the metal lines, the plurality of fractures are configured to divide the metal lines into a transmit electrode and a receive electrode, and the transmit electrode and the receive electrode form a touch capacitor structure at each fracture. A first direction is perpendicular to a conduction direction of each fracture, each of two ends of the fracture in the first direction is adjacent to two sides of at least one mesh unit, and the fracture is configured to electrically isolate mesh units on two sides in the conduction direction of the fracture.

In this application, the transmit electrode and the receive electrode are isolated at the touch electrode layer by using the fractures, and the transmit electrode and the receive electrode form the touch capacitor structure at each fracture, to implement a capacitive touch function of the touch film. In addition, each fracture is supported by at least two sides of the mesh unit, so that metal lines on two sides of the fracture do not form a single cantilever structure, and structural strength of the touch film at the fracture is improved. When the touch film is subject to an external pressing force or is bent, a stress value at a position of the fracture is correspondingly reduced, and the dielectric isolation layer filled in the fracture is not prone to brittle fracture due to a reduced stress. This improves the structural strength of the touch film.

In a possible implementation, the fractures include first fractures. Each first fracture is located between opposite vertex angles of at least two diagonally adjacent mesh units. The fracture is adjacent to the vertex angles, and a width of the first fracture in the first direction is within a range of 1 micrometer to 10 micrometers.

In a possible implementation, the mesh units include first mesh units. The first mesh units are located at an edge of the transmit electrode and/or the receive electrode. At least one vertex angle of each first mesh unit is adjacent to the fractures.

The first mesh units are used as edge meshes of the transmit electrode and the receive electrode. Each first mesh unit of a closed structure can enhance strength of the capacitor structure between the transmit electrode and the receive electrode. When the first mesh unit undergoes deformation such as bending, the capacitor structure is not prone to be deformed or fractured. This improves structural strength of a separation region between the transmit electrode and the receive electrode, and reduces a stress value of the dielectric isolation layer in the fractures during bending.

In a possible implementation, the mesh units include second mesh units. All side metal lines of the second mesh units are isolated from the fractures.

The second mesh units are mesh units in internal regions of the transmit electrode and the receive electrode. The second mesh units of a closed structure can improve structural strength of the transmit electrode and the receive electrode, and are not prone to be fractured when the transmit electrode and the receive electrode are deformed.

This improves the structural strength of the transmit electrode and the receive electrode.

In a possible implementation, the mesh units include third mesh units. The third mesh units are communicated with the fractures, and two adjacent third mesh units are communicated with each other.

The third mesh units are of an open structure. The plurality of third mesh units are communicated with each other through the fractures, and two sides of the third mesh units are respectively the transmit electrode and the receive electrode.

In a possible implementation, the transmit electrode includes a plurality of transmit modules, and the receive electrode includes a plurality of receive modules. At least some of the transmit modules and at least some of the receive modules are disposed in a staggered manner. There is a receive module between at least some pairs of adjacent transmit modules. The touch electrode layer includes a first metal bridge, and the first metal bridge electrically connects at least two of the transmit modules. Electrical connection between adjacent transmit modules is implemented by using the first metal bridge.

In a possible implementation, the first metal bridge spans one side of the receive module and is electrically connected to the two adjacent transmit modules. The receive module between the two adjacent transmit modules is electrically isolated from the first metal bridge, to ensure the capacitor structure between the transmit electrode and the receive electrode.

In a possible implementation, the transmit electrode includes a plurality of transmit modules, and the receive electrode includes a plurality of receive modules. At least some of the transmit modules and at least some of the receive modules are disposed in a staggered manner. There is a transmit module between at least some pairs of adjacent receive modules. The touch electrode layer includes a second metal bridge, and the second metal bridge electrically connects at least two of the receive modules. Electrical connection between adjacent receive modules is implemented by using the second metal bridge.

In a possible implementation, the second metal bridge spans one side of the transmit module and is electrically connected to the two adjacent receive modules. The transmit module between the two adjacent receive modules is electrically isolated from the second metal bridge, to ensure the capacitor structure between the transmit electrode and the receive electrode.

In a possible implementation, the transmit electrode and the receive electrode are not in a same layer in the dielectric isolation layer, to form a double-layer or multi-layer touch electrode layer structure.

In a possible implementation, the touch electrode layer includes a first connection electrode. The transmit electrode includes a plurality of transmit modules. The first connection electrode electrically connects at least two of the transmit modules. The first connection electrode and the transmit electrode are located at a same layer, to implement an electrical connection between adjacent transmit modules.

In a possible implementation, the touch electrode layer includes a second connection electrode. The receive electrode includes a plurality of receive modules. The second connection electrode electrically connects at least two of the receive modules. The second connection electrode and the receive electrode are located at a same layer, to implement an electrical connection between adjacent receive modules.

According to a second aspect, this application provides a touchscreen, including a light-emitting layer, a packaging layer, and the touch film according to any one of the foregoing descriptions. The touch film, the packaging layer, and the light-emitting layer are sequentially stacked, and a display screen having a touch function is formed by using a packaging technology and depositing the touch film on the light-emitting layer.

In a possible implementation, the light-emitting layer includes a pixel definition layer. The pixel definition layer includes a plurality of pixels. The plurality of pixels are arranged in a matrix manner, and the plurality of pixels are in a one-to-one correspondence with a plurality of mesh units in a light-emitting direction of the light-emitting layer.

In a possible implementation, a projection of each pixel on a touch electrode layer in the light-emitting direction of the light-emitting layer falls within a mesh unit corresponding to the pixel. There is a gap between a side metal line of the mesh unit and the projection that falls within the mesh unit. Each mesh unit corresponds to one pixel, and light emitted by the pixel may pass through the touch film by using the mesh unit.

In a possible implementation, a spacing between two adjacent pixels is greater than a width of a metal line, so that light emitted by each pixel in a light-emitting direction passes through a mesh unit without being blocked by the metal line.

In a possible implementation, a first plane is a plane perpendicular to the light-emitting direction of the light-emitting layer, and a spacing between the metal line and an edge of the pixel is within a range of 1 micrometer to 10 micrometers along the first plane.

In a possible implementation, the light-emitting layer includes an OLED light-emitting layer.

According to a third aspect, this application provides an electronic device, including a display screen. The display screen includes the touchscreen according to any one of the foregoing descriptions.

In a possible implementation, the electronic device includes a foldable mobile phone. The foldable mobile phone includes the display screen, and the display screen is a flexible foldable display screen.

DESCRIPTION OF EMBODIMENTS

Figure 1:
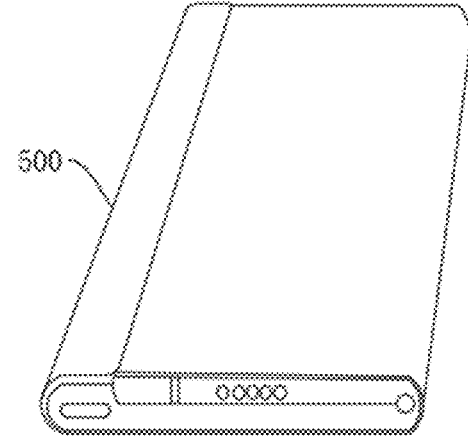
FIG. 1 is a schematic diagram of a foldable mobile phone in a folded state according to an implementation of this application.

The following describes embodiments of this application with reference to the accompanying drawings in embodiments of this application.

For ease of understanding, the following first explains and describes English abbreviations and related technical terms used in embodiments of this application. OLED (Organic Light-Emitting Diode), also referred to as organic electroluminescence display (Organic Electroluminescence Display), is a current-type organic light-emitting device. The OLED emits light through injection and recombination of carriers. Light-emitting intensity is in direct proportion to an injected current. Under the action of an electric field, holes generated by an anode and electrons generated by a cathode of the OLED move, and are respectively injected into a hole transport layer and an electron transport layer, and migrated to a light-emitting layer. When the holes and the electrons meet in the light-emitting layer, energy excitons are generated, to excite light-emitting molecules to ultimately produce visible light.

It should be clear that the described embodiments are merely some rather than all of embodiments of this application. All other embodiments obtained by persons of ordinary skill in the art based on embodiments of this application without creative efforts shall fall within the protection scope of this application.

Terms used in embodiments of this application are merely for the purpose of describing specific embodiments, but are not intended to limit this application. The terms "a", "the", and "this" of singular forms used in embodiments and the appended claims of this application are also intended to include plural forms, unless otherwise specified in the context clearly.

It should be understood that the term "and/or" in this specification is merely a same field for describing associated objects and indicates that three relationships may exist. For example. A and/or B may indicate the following three cases: Only A exists, both A and B exist, and only B exists. In addition, the character "/" in this specification usually indicates an "or" relationship between associated objects.

The term "within a range" used in this specification includes two end values, for example, within a range of A to B, including end values A and B.

With development of electronic product technologies, product forms of electronic devices such as mobile phones and tablet computers become increasingly diversified. A foldable mobile phone is used as an example. An outline size of the mobile phone can be effectively reduced by mobile phone folding, so that it is convenient to carry. In early mobile phone products, due to a limitation of a touch technology, input of a mobile phone is generally implemented by a keyboard. The keyboard and a display screen are two components connected by using a transmission data link. It is easy to implement folding of the mobile phone. Currently, a display screen of a mobile phone generally has a touch function, so that input and display output of the mobile phone are integrated, and a size of a display screen of the mobile phone may be increased to 6.74 inches. There are various technical means for implementing light, thin, and highly integrated touch technologies, for example, a full lamination technology, including add-on solutions such as GFF, OGS, GF2, Metalmesh, and OGM, and solutions such as TOE (Touch on Encapsulation). On-cell, and In-cell that are directly integrated with a display panel.

As people have an increasing requirement for functions of a mobile phone, a size of a mobile phone screen also needs to be continuously increased to meet a display requirement of people for the mobile phone. The increase in the size of the mobile phone screen affects portability of the mobile phone. A setting-out size of the mobile phone can be effectively reduced by mobile phone folding. In addition, development of an existing flexible touchscreen implements screen folding, so that a whole screen can be folded into two split screens, and content of different sizes is displayed in different mobile phone forms.

Figure 2:
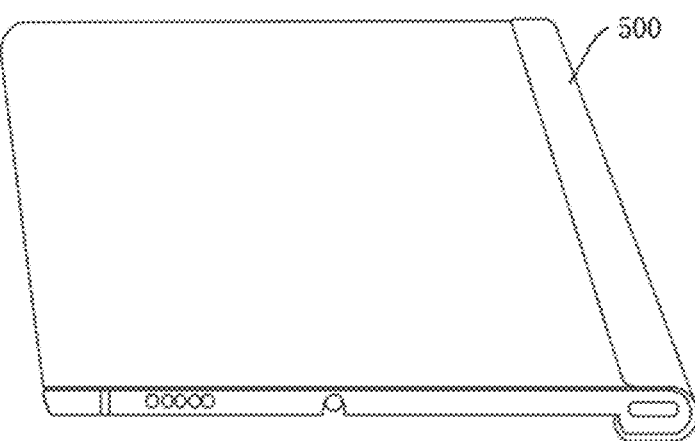
FIG. 2 is a schematic diagram of a foldable mobile phone in an unfolded state according to an implementation of this application.

With emergence of a foldable mobile phone, a size of a display screen when the mobile phone is used is effectively increased. Refer to FIG. 1 and FIG. 2. FIG. 1 is a state diagram of a foldable mobile phone 500 when the foldable mobile phone 500 is folded. A screen of the mobile phone in a folded state may be in an outward folding form (the screen in the folded state is located on an outer side surface of the mobile phone, as shown in FIG. 1, both an upper side and a lower side are display screens, and in this case, the screen of the mobile phone can still display information). Alternatively, a screen of the mobile phone in a folded state may be in an inward folding form (the screen in the folded state is located on a folded inner side of the mobile phone, as shown in FIG. 1, both an upper side surface and a lower side surface are housings, the screen is folded and hidden inside the mobile phone, and the screen can be displayed only when the mobile phone is unfolded). FIG. 2 is a state diagram of the foldable mobile phone 500 when the foldable mobile phone 500 is unfolded. In FIG. 1, a lower half part of the mobile phone in the folded state is rotated by 180 degrees in a counterclockwise manner, to present the mobile phone in an unfolded state shown in FIG. 2. In this implementation, a mobile phone in an outward folding form is used as an example, and an entire plane on an upper side in FIG. 2 is a screen.

The foldable mobile phone 500 is switched reciprocally between the folded state and the unfolded state in use, and therefore has a high requirement for structural strength of a flexible screen. For an existing flexible screen, for example, an OLED display screen, an inorganic isolation layer is generally deposited on flexible OLEDs, and then physical electrodes required for a touchscreen are formed in a connection manner such as metal deposition, patterning, and bridge electrical connection.

Figure 3:
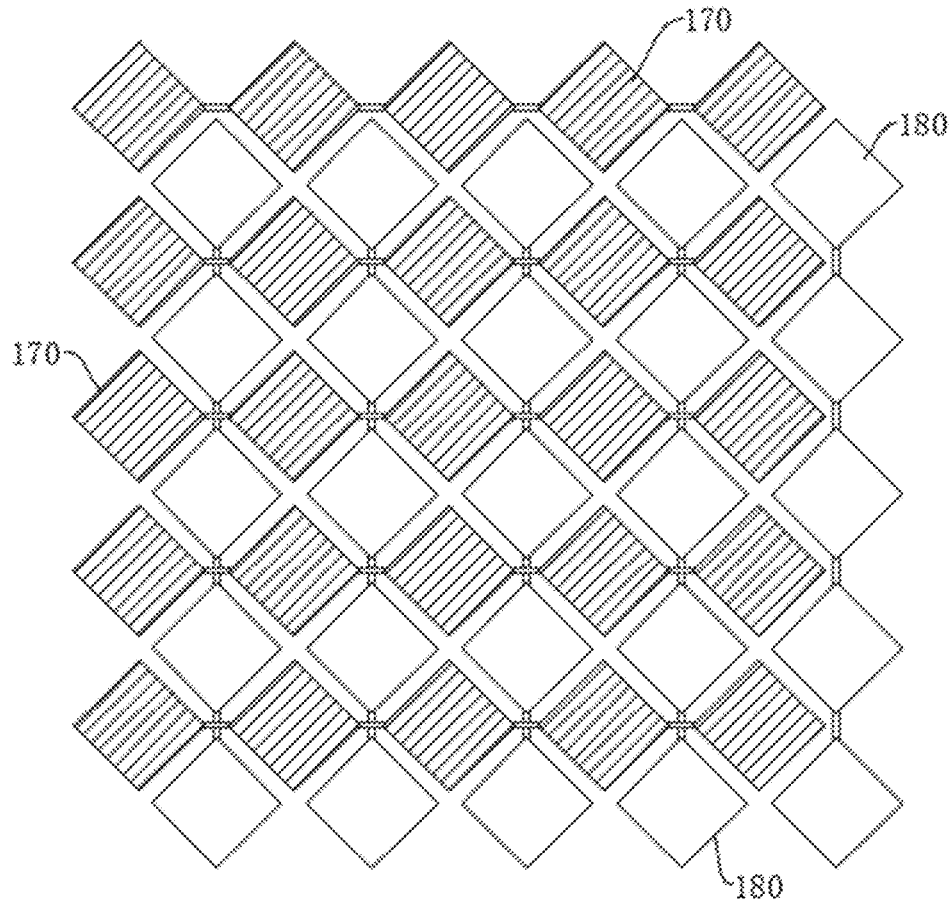
FIG. 3 is a schematic diagram of a structure of a touch electrode layer according to an implementation of this application.

FIG. 3 is a schematic diagram of a structure of a touch electrode layer. Electrodes include a first electrode 170) and a second electrode 180. As shown in FIG. 3, shaded electrode blocks (the shadow is merely used for distinguishing from the second electrode when being displayed in FIG. 3, and in practice, a style of the first electrode 170 may be the same as that of the second electrode 180, or a color of the first electrode 170 may be different from that of the second electrode 180) in FIG. 3 are connected in series to form the first electrode 170, and blank electrode blocks in FIG. 3 are connected in series to form the second electrode 180. The first electrode 170) extends in a horizontal direction shown in FIG. 3, and the second electrode 180) extends in a longitudinal direction shown in FIG. 3. The first electrode 170 and the second electrode 180 are stacked in an up-down manner at a staggered position. In addition, the first electrode 170) and the second electrode 180 are electrically isolated from each other at the staggered position. In this application, electrical isolation means that an electrical connection is isolated, to be specific, an electrical connection between the first electrode 170) and the second electrode 180 is isolated at the staggered position. For example, a bridge structure may be disposed at the staggered position between the first electrode 170 and the second electrode 180 to implement electrical isolation between the first electrode 170 and the second electrode 180. Two adjacent electrode plates in the first electrode 170 are connected through a bridge, the bridge passes through a bottom side of the second electrode 180, and a specific gap is reserved between the bridge and the second electrode 180; and/or two adjacent electrode plates in the second electrode 180 are connected through a bridge, the bridge passes through an upper side of the first electrode 170, and a specific gap is reserved between the bridge and the first electrode 170.

Figure 4:
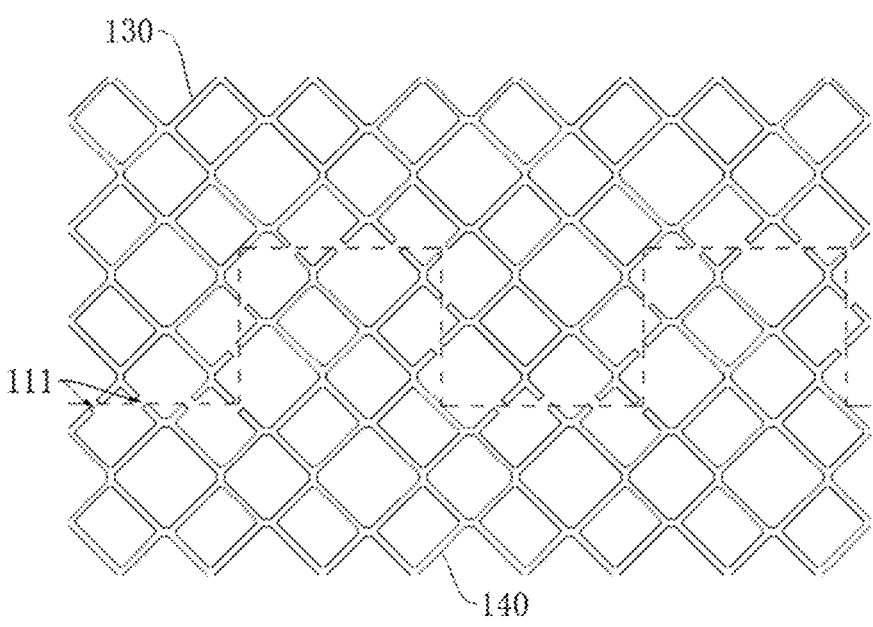
FIG. 4 is a schematic diagram of a structure in which fractures are provided on sides of mesh units according to this application.

For the foregoing flexible display screen, a touch film with electrodes may be integrated on the flexible OLED, and presents a mesh structure shown in FIG. 4. FIG. 4 is a schematic diagram of a structure in which fractures are provided on sides of mesh units. There are hollow parts in the middle of a metal mesh (metal mesh). The hollow parts are opposite to pixels of the OLED, and each hollow part is opposite to one pixel, to form a flexible OLED touchscreen having a touch function.

As shown in FIG. 4, an existing thin film touch metal mesh (metal mesh) is formed after patterning of primary metal film formation, and therefore is located at a same laminated spatial position in a light-emitting direction of the OLED (a direction perpendicular to a plane in which FIG. 4 is located). To form a transmit electrode (TX) and a receive electrode (RX) on the metal mesh and implement a physical function of capacitive touch, the transmit electrode (TX) and the receive electrode (RX) need to be physically disconnected. Currently, fractures 111 with a width less than 10 μm are generally provided, to form physical electrical isolation at two ends of each fracture. As shown in FIG. 4, the fractures 111 are usually located at middle positions of meshes of the mesh units. The metal meshes on two sides of the fractures are respectively a transmit electrode 130 and a receive electrode 140. The transmit electrode 130 and the receive electrode 140 form a capacitor structure at each fracture. In FIG. 4, a dashed line sequentially passes through each fracture 111, and two sides of the dashed line are separated by the fractures 111 into the transmit electrode 130 and the receive electrode 140. When a finger is in contact with an outer side surface of the touchscreen formed by the touch film, a capacitor voltage at a contact position changes, and a touch position is determined based on the capacitance change. However, in the foregoing disconnection manner, a section of metal is bound to be in a suspended state. When the touchscreen of a bent part of the foldable mobile phone is bent, a stress concentration is formed at positions of the fractures 111. Consequently, a dielectric isolation layer of the touchscreen fractures due to the stress concentration, resulting in a failure of the touch function and the screen. In addition, for a non-foldable mobile phone, when a screen of the mobile phone is subject to a large stress, a brittle fracture may also occur on a dielectric isolation layer at fractures due to a stress concentration, resulting in a failure of a touch function and the screen.

Figure 5:
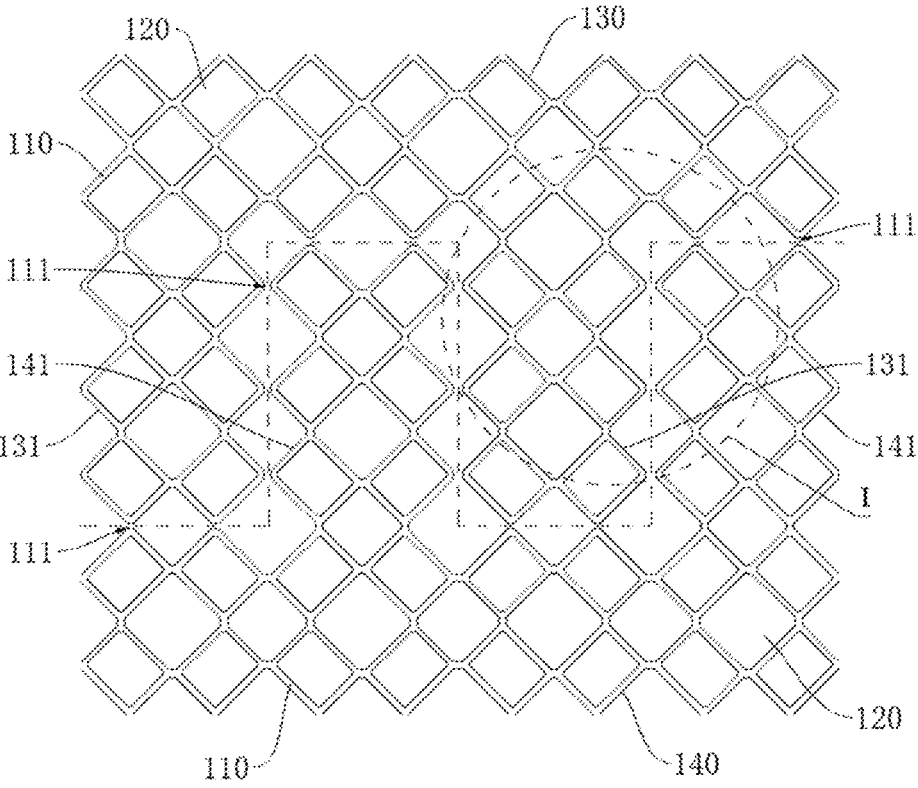
FIG. 5 is a schematic diagram of a touch electrode layer of a quadrangular mesh unit structure according to an implementation of this application.
Figure 6:
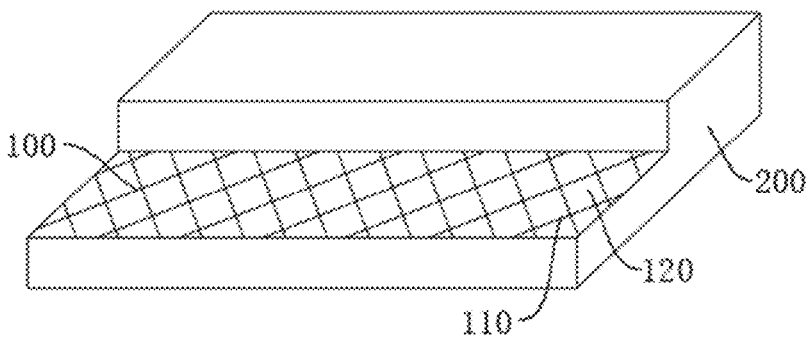
FIG. 6 is a structure of a touch electrode layer and a dielectric isolation layer according to an implementation of this application.

To improve structural strength of a touchscreen, this application provides a touch film. Refer to FIG. 5 and FIG. 6. FIG. 5 is a schematic diagram of a touch electrode layer 100 of a quadrangular mesh unit structure in the touch film. FIG. 6 is a schematic diagram of a part of the touch electrode layer 100 and a dielectric isolation layer 200 in the touch film. In FIG. 6, a part of the dielectric isolation layer 200 above the touch electrode layer 100 is hidden, to better display a relative position relationship between the touch electrode layer 100 and the dielectric isolation layer 200.

The touch film includes the touch electrode layer 100 and the dielectric isolation layer 200. The touch electrode layer 100 is located in the dielectric isolation layer 200. The touch electrode layer 100 includes a plurality of metal lines 110. A part of the metal lines 110 are first metal lines, and the first metal lines are parallel to each other and extend in a lower left direction. The other part of the metal lines 110 are second metal lines, and the second metal lines are parallel to each other and extend in a lower right direction. The two parts of the metal lines 110 are arranged in a cross manner to form the mesh-shaped touch electrode layer 100. The touch electrode layer 100 may also be referred to as a metal mesh (metal mesh).

A polygonal unit enclosed by a plurality of adjacent metal lines is a mesh unit 120. The touch electrode layer 100 includes a plurality of mesh units 120. The mesh units 120 are polygonal. Some mesh units 120 have a same size, and some mesh units 120 have different sizes. Specifically, the mesh unit 120 includes a plurality of side metal lines and a cavity region enclosed by the metal lines. In this implementation, a quadrangular mesh unit 120 is used as an example.

Figure 7:
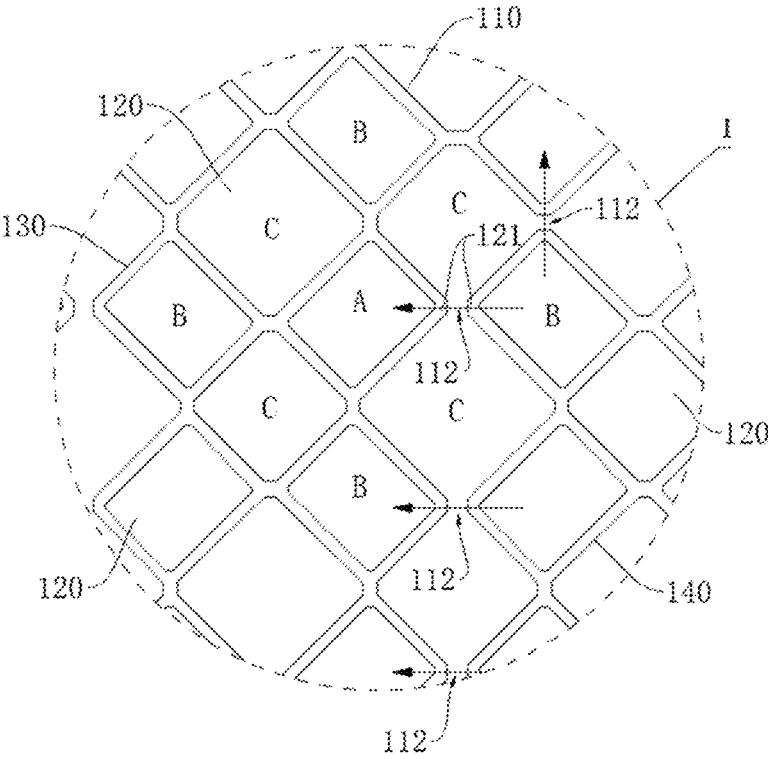
FIG. 7 is an enlarged diagram of a part I in FIG. 5 according to this application.

FIG. 7 is an enlarged diagram of a part I in FIG. 5, to display the fractures 111 more clearly. The fractures 111 are provided on the metal lines 110. Specifically, a first direction is a direction perpendicular to a conduction direction of each fracture 111, each of two ends of the fracture 111 in the first direction is adjacent to two sides of at least one mesh unit, and the fracture 111 is configured to electrically isolate (not conduct) mesh units 120 on two sides in the conduction direction of the fracture 111. Each of the two ends of the fracture 111 in the first direction is adjacent to the two sides of the at least one mesh unit, so that metal lines on the two sides of the fracture 111 do not form a single cantilever structure, but are jointly supported by the at least two metal lines of the mesh unit, so that structural strength of the touch film at the fracture is improved. When the touch film is subject to an external pressing force or is bent, a stress value at a position of the fracture is correspondingly reduced, and the dielectric isolation layer filled in the fracture is not prone to brittle fracture due to a reduced stress. This improves the structural strength of the touch film.

Specifically, as shown in FIG. 7, the fractures 111 in this implementation include first fractures 112. Each first fracture 112 is located between two opposite vertex angles 121 of two diagonally adjacent mesh units 120.

In this application, "diagonally adjacent" means that two mesh units 120 are adjacent in a diagonal direction. As shown in FIG. 7, a mesh unit A is used as an example. The mesh unit A is provided with four mesh units C that are adjacent to the mesh unit A on sides, and the mesh unit A and each mesh unit C that are adjacent to each other on the side share a same side. The mesh unit A is provided with four mesh units B that are diagonally adjacent to the mesh unit A, and the mesh unit A and each mesh unit B that is diagonally adjacent to the mesh unit A have opposite angles.

As shown in FIG. 7, the mesh unit A is used as an example. There is a first fracture 112 between the mesh unit A and the mesh unit B on a right side of the mesh unit A, and a touch capacitor structure is formed between the mesh unit A and the mesh unit B on the right side of the mesh unit A. As shown in FIG. 5, a plurality of first fractures 112 are provided on the touch electrode layer 100, and the plurality of first fractures 112 are arranged according to a specific rule, to divide the metal lines 110 into the transmit electrode 130 and the receive electrode 140. The transmit electrode 130 and the receive electrode 140 are electrically isolated at each first fracture 112, so that the transmit electrode 130 and the receive electrode 140 form a touch capacitor structure at the first fracture 112.

In this implementation, the first fractures 112 on the touch electrode layer 100 are provided at vertex angles of the mesh units 120. The transmit electrode 130 and the receive electrode 140 are isolated by using the first fractures 112, and the transmit electrode 130 and the receive electrode 140 form the touch capacitor structure at each first fracture 112, to implement a capacitive touch function of the touch film. In addition, the first fractures 112 located at the vertex angles of the mesh units 120 eliminate physical existence space of suspended metal. When the touch film is subject to the external pressing force or is bent, a stress value at a position of the first fracture 112 is correspondingly reduced, and the dielectric isolation layer filled in the first fracture 112 is not prone to brittle fracture due to a reduced stress. This improves the structural strength of the touch film.

Specifically, a reciprocal bending test is performed on the touch electrode layer 100 (the fractures are located at the sides of the mesh units) shown in FIG. 4 and the touch electrode layer 100 (the fractures are located at the vertex angles of the mesh units) shown in FIG. 5. In a bending process, a stress on the fractures in a bending region is tested, and a strain concentration factor of the fractures at the sides of the mesh units is 1.676, and a strain concentration factor of the fractures at the vertex angles of the mesh units is 1.503. In comparison with the fractures located at the sides of the mesh units, the strain concentration factor of the fractures located at the vertex angles of the mesh units may be reduced by 10.32%. This effectively reduces a stress degree of the touchscreen under deformation such as bending, and avoids damages such as fracture of the touch film after the touch film is bent for a plurality of times.

In a possible implementation, as shown in FIG. 7, a width of the first fracture 112 is within a range of 1 micrometer to 10 micrometers. The width of the first fracture 112 is a width of the first fracture 112 in the first direction, and the first direction is a direction of a connection line between two diagonally adjacent mesh units 120 that are separated by the first fracture 112. For example, in FIG. 7, a direction indicated by an arrow corresponding to a position of each first fracture 112 is the first direction corresponding to the first fracture 112. The first direction may alternatively be a reverse direction of the direction indicated by the arrow shown in FIG. 7.

The mesh unit A is used as an example. A fracture is provided between the mesh unit A and the mesh unit B on the right side. A direction of a connection line between the mesh unit A and the mesh unit B is the first direction. The width of the first fracture 112 in the first direction is within the range of 1 micrometer to 10 micrometers, to ensure that the transmit electrode 130 and the receive electrode 140 form effective electrical isolation at each fracture 111, and form the touch capacitor structure.

Figure 8:
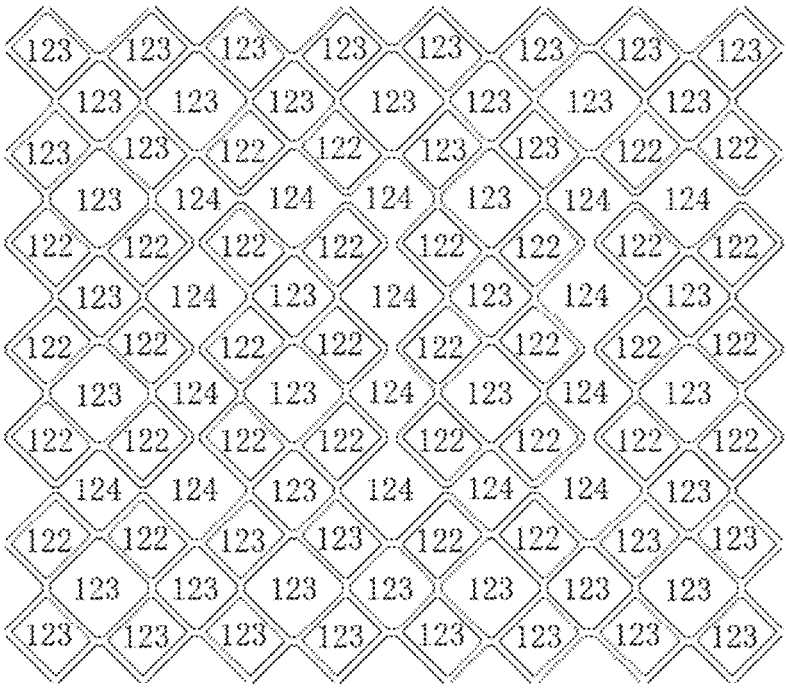
FIG. 8 is a schematic diagram of a structure of mesh units according to an implementation of this application.

In a possible implementation, as shown in FIG. 5 and FIG. 8, the mesh units 120 include first mesh units 122. The first mesh unit 122 is located at an edge of the transmit electrode 130 and the receive electrode 140, and at least one vertex angle of each first mesh unit 122 is adjacent to the fractures 111. Each first mesh unit 122 is provided with at least one next-nearest neighbor mesh unit. For example, the mesh unit A in FIG. 7 is one of the first mesh units 122, the first mesh unit 122 is provided with four next-nearest neighbor mesh units B. Each next-nearest neighbor mesh unit in this implementation is diagonally adjacent to the first mesh unit 122. In addition, there is a first fracture 112 between the first mesh unit 122 and an opposite vertex angle 121 of at least some of the next-nearest neighbor mesh units, and the first fracture 112 electrically isolates the first mesh unit 122 from the next-nearest neighbor mesh unit.

In this implementation, there is no fracture 111 on the metal lines 110 enclosing the first mesh unit 122. The first mesh unit 122 is not communicated with a mesh unit that is adjacent to the first mesh unit 122 on a side, and the first mesh unit 122 is not communicated with a mesh unit that is diagonally adjacent to the first mesh unit 122 either. The first mesh unit 122 is enclosed by the metal lines 110 to form a closed structure. For the first mesh units 122 located in the bending region of the touchscreen, the first mesh units 122 are used as edge meshes of the transmit electrode 130 and the receive electrode 140. Each first mesh unit 122 of a closed structure can enhance strength of the capacitor structure between the transmit electrode 130 and the receive electrode 140. When the first mesh unit 122 undergoes deformation such as bending, the capacitor structure is not prone to be deformed or fractured. This improves structural strength of a separation region between the transmit electrode 130 and the receive electrode 140, and reduces a stress value of the dielectric isolation layer in the fractures 111 during bending. In this application, the main purpose is to reduce a stress value of an inorganic layer in the dielectric isolation layer during bending.

The transmit electrode 130 includes a plurality of mesh units 120, and the receive electrode 140 also includes a plurality of mesh units 120. As shown in FIG. 6 and FIG. 8, an example in which an upper part is the transmit electrode 130 and a lower part is the receive electrode 140 is used. The fractures 111 are arranged in a sawtooth-like route between the transmit electrode 130 and the receive electrode 140, to form the transmit electrode 130 and the receive electrode 140 that are located in a cross staggered manner. The edge meshes of the transmit electrode 130 and the receive electrode 140 are the first mesh units 122. Each fracture 111 is provided between the first mesh unit 122 of the transmit electrode 130 and the first mesh unit 122 of the receive electrode 140, to form the touch capacitor structure.

In this implementation, for some mesh units, there is a fracture 111 between each of the mesh units and at least one next-nearest neighbor mesh unit of the mesh unit. The mesh units are the first mesh units 122. The first mesh units 122 are mesh units at edges of the transmit electrode 130 and the receive electrode 140. Two sides that are of the first mesh unit 122 and that are adjacent to the fracture 111 play a main support role for the metal lines at the fracture 111.

In a possible implementation, as shown in FIG. 8, the mesh units 120 include second mesh units 123. All side metal lines of the second mesh units 123 are isolated from the fractures 111. All side metal lines of the second mesh units 123 are not directly connected to the fractures 111, but are separated by a spacing of a side width of at least one mesh unit 120. Each second mesh unit 123 is provided with at least one next-nearest neighbor mesh unit, and each next-nearest neighbor mesh unit is diagonally adjacent to the second mesh unit 123 that matches the next-nearest neighbor mesh unit. The second mesh unit 123 is electrically connected to all the next-nearest neighbor mesh units corresponding to the second mesh unit 123 at opposite vertex angles, and no fracture 111 is provided between the second mesh unit 123 and all the next-nearest neighbor mesh units corresponding to the second mesh unit 123. For example, in FIG. 7, a mesh unit C at the upper left or lower left of the mesh unit A is one of the second mesh units 123, and no fracture 111 is provided between the second mesh unit 123 and a mesh unit that is diagonally adjacent to the second mesh unit 123. The second mesh unit 123 is not located in the adjacent edge meshes the transmit electrode 130 and the receive electrode 140, but is located in internal meshes of the transmit electrode 130 and the receive electrode 140.

In this implementation, there is no fracture 111 on the metal lines 110 enclosing the second mesh unit 123. The second mesh unit 123 is not communicated with a mesh unit that is adjacent to the second mesh unit 123 on a side, and the second mesh unit 123 is not communicated with a mesh unit that is diagonally adjacent to the second mesh unit 123 either. The second mesh unit 123 is enclosed by the metal lines 110 to form a closed structure. The second mesh units 123 are mesh units in internal regions of the transmit electrode 130 and the receive electrode 140. Each second mesh unit 123 of the closed structure can improve structural strength of the transmit electrode 130 and the receive electrode 140, and is not prone to be fractured when the transmit electrode 130 and the receive electrode 140 are deformed. This improves the structural strength of the transmit electrode 130 and the receive electrode 140.

In a possible implementation, as shown in FIG. 8, the mesh units 120 include third mesh units 124. Each third mesh unit 124 is communicated with the fractures 111, and two adjacent third mesh units 124 are communicated with each other. Each third mesh unit 124 is provided with a plurality of next-nearest neighbor mesh units, and the third mesh unit 124 is diagonally adjacent to the next-nearest neighbor mesh units corresponding to the third mesh unit 124. A fracture 111 is provided between at least some of the next-nearest neighbor mesh units corresponding to the third mesh unit 124 and the third mesh unit 124. A second direction is a direction of a connection line between the third mesh unit 124 and each next-nearest neighbor mesh unit corresponding to the third mesh unit 124. For example, a direction of a connection line between two adjacent third mesh units 124 in FIG. 8 is the second direction, and the conduction direction of the fracture 111 is consistent with the second direction.

In this implementation, the third mesh units 124 are of an open structure, and the metal lines 110 around the third mesh units 124 are disconnected at the vertex angles to form fracture 111 structures. In addition, a plurality of third mesh units 124 are communicated with each other through the fractures 111. Two sides of the third mesh units 124 are respectively the transmit electrode 130 and the receive electrode 140. The touch electrode layer 100 forms the touch capacitor structures at the plurality of communicated third mesh units 124.

Figure 9:
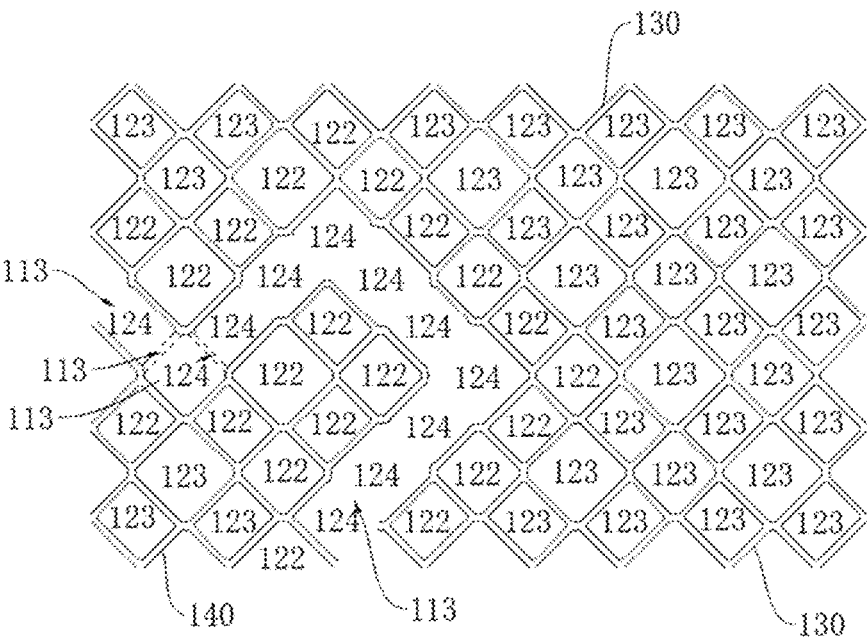
FIG. 9 is a schematic diagram of a touch electrode layer of a quadrangular mesh unit structure according to an implementation of this application.

In a possible implementation, as shown in FIG. 9, the fractures 111 provided on the touch film may alternatively include second fractures 113. Both ends of each second fracture 113 are separately adjacent to at least two side metal lines of the first mesh unit 122. In this implementation, as shown in FIG. 9, after the entire metal mesh is deposited, the metal lines at positions indicated by double dashed lines in FIG. 9 are etched off, to form the second fractures 113 in this implementation. A conduction direction of the second fracture 113 is communicated with the third mesh units 124 on two sides, to form a separation capacitor structure between the transmit electrode 130 and the receive electrode 140.

Two sides of each third mesh unit 124 are removed to form the second fracture 113, and the second fracture 113 is communicated with the third mesh unit 124 to form a capacitor channel structure. One vertex angle of the first mesh unit 122 located at the edges of the transmit electrode 130 and the receive electrode 140 is adjacent to the second fracture 113, and at least two sides of the first mesh unit 122 provide support for the second fracture 113.

Specifically, all side metal lines of the second mesh units 123 are isolated from the second fractures 113. All side metal lines of the second mesh units 123 are not directly connected to the second fractures 113, but are separated by a spacing of a side width of at least one mesh unit 120. There is no second fracture 113 on the metal lines 110 enclosing the second mesh unit 123. The second mesh unit 123 is not communicated with a mesh unit that is adjacent to the second mesh unit 123 on a side, and the second mesh unit 123 is not communicated with a mesh unit that is diagonally adjacent to the second mesh unit 123 either. The second mesh unit 123 is enclosed by the metal lines 110 to form a closed structure. The second mesh units 123 are mesh units in internal regions of the transmit electrode 130 and the receive electrode 140. Each second mesh unit 123 of the closed structure can improve structural strength of the transmit electrode 130 and the receive electrode 140, and is not prone to be fractured when the transmit electrode 130 and the receive electrode 140 are deformed. This improves the structural strength of the transmit electrode 130 and the receive electrode 140.

Figure 10:
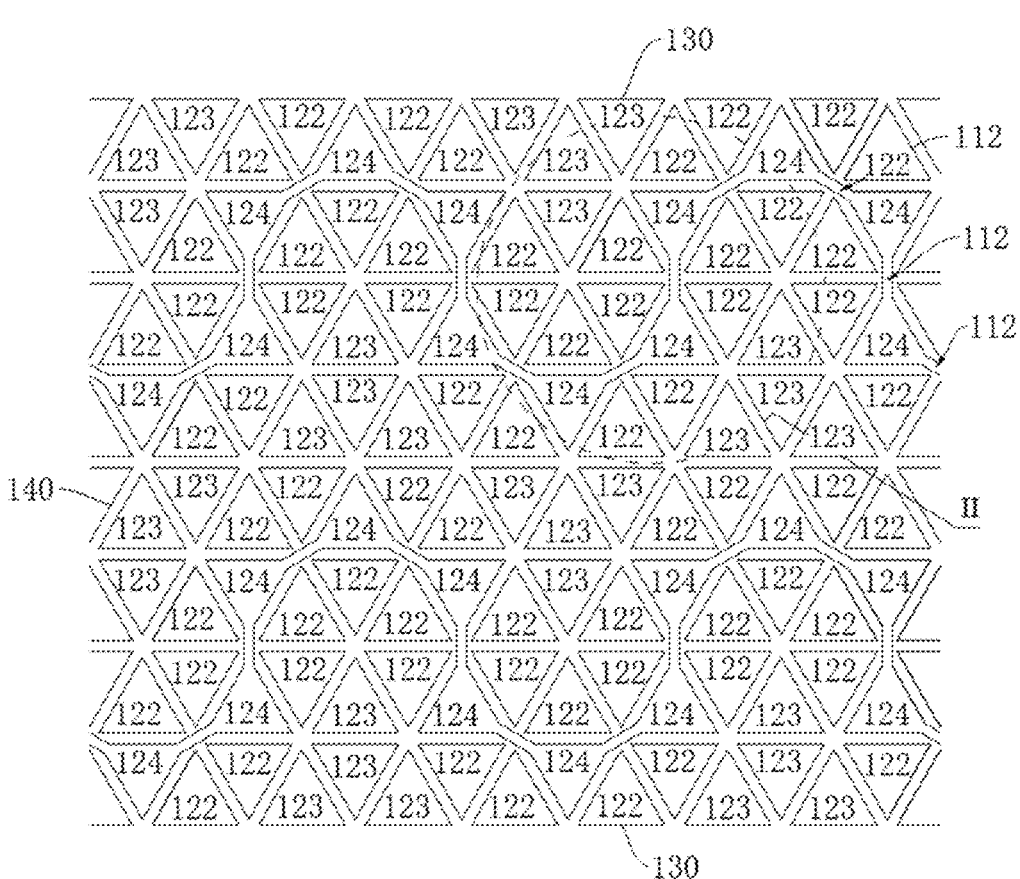
FIG. 10 is a schematic diagram of a touch electrode layer of a triangular mesh unit structure according to an implementation of this application.

In a possible implementation, as shown in FIG. 10, the mesh units 120 shown in this implementation are triangular.

Figure 11:
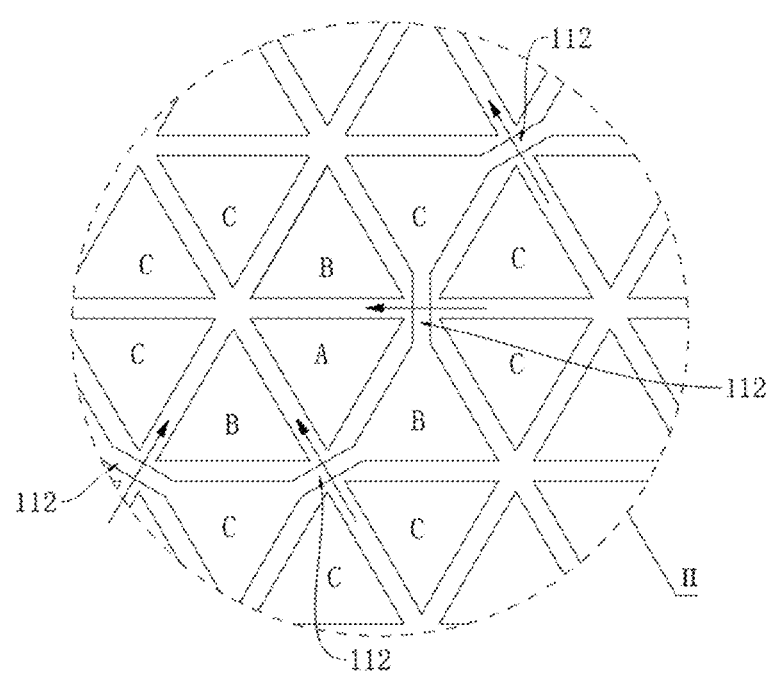
FIG. 11 is an enlarged diagram of a part II in FIG. 10 according to this application.

As shown in FIG. 11, the fractures 111 provided on the touch film in this implementation are first fractures 112. As shown in FIG. 11, a mesh unit A is used as an example. The mesh unit A is provided with three mesh units B that are adjacent to the mesh unit A on sides, and is further provided with nine mesh units C that are diagonally adjacent to the mesh unit A. The mesh unit A is disconnected from two mesh units C below to form one first fracture 112, and each mesh unit B is disconnected from two mesh units C on a right side to form one first fracture 112. The first fracture 112 is located between two diagonally adjacent mesh units 120. In addition, the first fracture 112 described in this implementation may be located between a plurality of pairs of two diagonally adjacent mesh units 120.

A direction indicated by a direction of a straight line arrow shown in FIG. 11 may be a first direction, and the first direction is perpendicular to a conduction direction of the fracture 111. Both ends of each first fracture 112 in the first direction are adjacent to two sides of two mesh units, the two mesh units share one side, and the three metal lines jointly support the corresponding first fracture 112. In addition, a width of the first fracture 112 in the first direction may be within a range of 1 micrometer to 10 micrometers.

As shown in FIG. 10 and FIG. 11, there are a plurality of first fractures 112, and the plurality of first fractures 112 are communicated. In addition, a third mesh unit 124 is communicated between two adjacent first fractures 112, and the transmit electrode 130 and the receive electrode 140 form a capacitor structure at the first fracture 112.

First mesh units 122 are located at an edge of the transmit electrode 130 and the receive electrode 140. At least one vertex angle of each first mesh unit 122 is adjacent to the first fractures 112. Two sides of the first mesh unit 122 that are close to the fracture 111 play a main support role for the metal line at the fracture 111.

All side metal lines of the second mesh units 123 are isolated from the first fractures 112. All side metal lines of the second mesh units 123 are not directly connected to the first fractures 112, but are separated by a spacing of a side width of at least one mesh unit 120. There is no first fracture 112 on the metal lines 110 enclosing the second mesh unit 123. The second mesh unit 123 is not communicated with a mesh unit that is adjacent to the second mesh unit 123 on a side, and the second mesh unit 123 is not communicated with a mesh unit that is diagonally adjacent to the second mesh unit 123 either. The second mesh unit 123 is enclosed by the metal lines 110 to form a closed structure. The second mesh units 123 are mesh units in internal regions of the transmit electrode 130 and the receive electrode 140. Each second mesh unit 123 of the closed structure can improve structural strength of the transmit electrode 130 and the receive electrode 140, and is not prone to be fractured when the transmit electrode 130 and the receive electrode 140 are deformed. This improves the structural strength of the transmit electrode 130 and the receive electrode 140.

Figure 12:
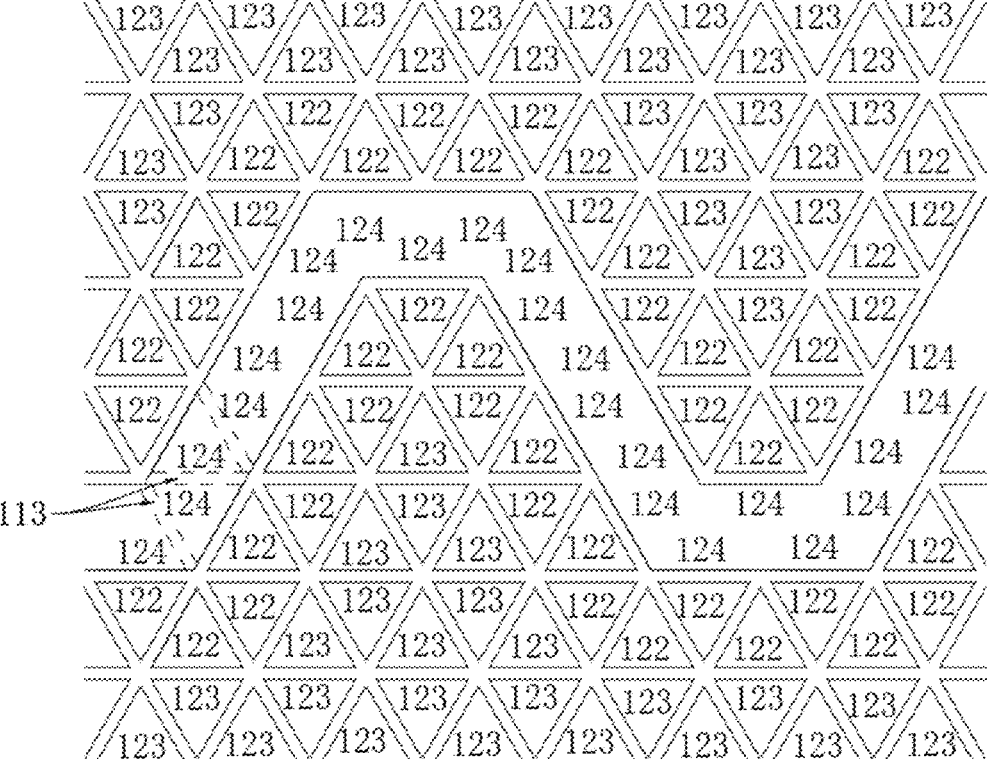
FIG. 12 is a schematic diagram of a touch electrode layer of a triangular mesh unit structure according to an implementation of this application.

In a possible implementation, as shown in FIG. 12, the mesh units 120 shown in this implementation are triangular. The fractures 111 provided on the touch film may alternatively include second fractures 113. Both ends of each second fracture 113 are separately adjacent to at least two side metal lines of the first mesh unit 122. In this implementation, as shown in FIG. 12, after the entire metal mesh is deposited, the metal lines at positions indicated by double dashed lines in FIG. 12 are etched off, to form the second fractures 113 in this implementation. A conduction direction of the second fracture 113 is communicated with the third mesh units 124 on two sides, to form a separation capacitor structure between the transmit electrode 130 and the receive electrode 140.

Two sides of each third mesh unit 124 are removed to form the second fracture 113, and the second fracture 113 is communicated with the third mesh unit 124 to form a capacitor channel structure. One vertex angle of the first mesh unit 122 located at the edges of the transmit electrode 130 and the receive electrode 140 is adjacent to the second fracture 113, and at least two sides of the first mesh unit 122 provide support for the second fracture 113.

Specifically, all side metal lines of the second mesh units 123 are isolated from the second fractures 113. All side metal lines of the second mesh units 123 are not directly connected to the second fractures 113, but are separated by a spacing of a side width of at least one mesh unit 120. There is no second fracture 113 on the metal lines 110 enclosing the second mesh unit 123. The second mesh unit 123 is not communicated with a mesh unit that is adjacent to the second mesh unit 123 on a side, and the second mesh unit 123 is not communicated with a mesh unit that is diagonally adjacent to the second mesh unit 123 either. The second mesh unit 123 is enclosed by the metal lines 110 to form a closed structure. The second mesh units 123 are mesh units in internal regions of the transmit electrode 130 and the receive electrode 140. Each second mesh unit 123 of the closed structure can improve structural strength of the transmit electrode 130 and the receive electrode 140, and is not prone to be fractured when the transmit electrode 130 and the receive electrode 140 are deformed. This improves the structural strength of the transmit electrode 130 and the receive electrode 140.

Figure 13:
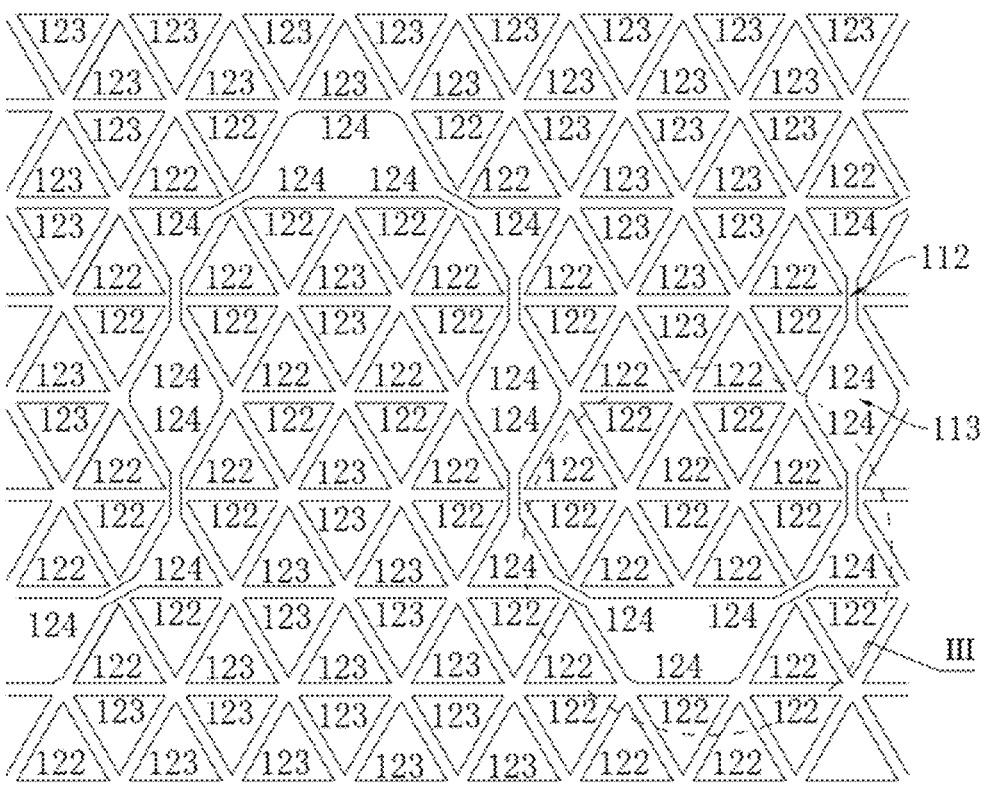
FIG. 13 is a schematic diagram of a touch electrode layer of a triangular mesh unit structure according to an implementation of this application.
Figure 14:
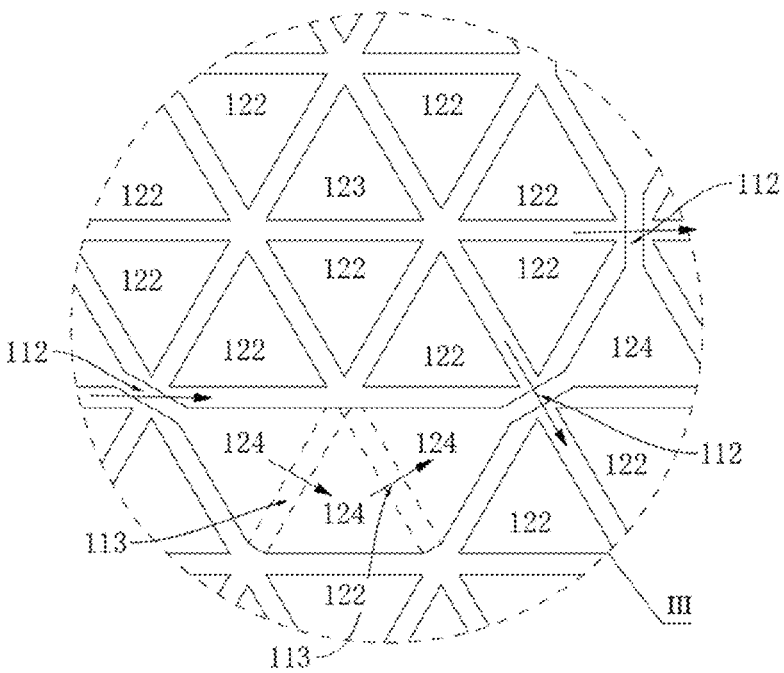
FIG. 14 is an enlarged diagram of a part III in FIG. 13 according to this application.

In a possible implementation, as shown in FIG. 13 and FIG. 14, the mesh units 120 shown in this implementation are triangular. The fractures 111 provided on the touch film may alternatively include first fractures 112 and second fractures 113.

A direction indicated by a direction of a straight line arrow shown in FIG. 14 may be a first direction, and the first direction is perpendicular to a conduction direction of the fracture. Both ends of each first fracture 112 in the first direction are adjacent to two sides of two mesh units, the two mesh units share one side, and the three metal lines jointly support the corresponding first fracture 112.

Both ends of each second fracture 113 are separately adjacent to at least two side metal lines of a first mesh unit 122. In this implementation, as shown in FIG. 14, after the entire metal mesh is deposited, the metal lines at positions indicated by double dashed lines in FIG. 14 are etched off, to form the second fractures 113 in this implementation. A conduction direction of the second fracture 113 is communicated with the third mesh units 124 on two sides, to form a separation capacitor structure between the transmit electrode 130 and the receive electrode 140.

Figure 15:
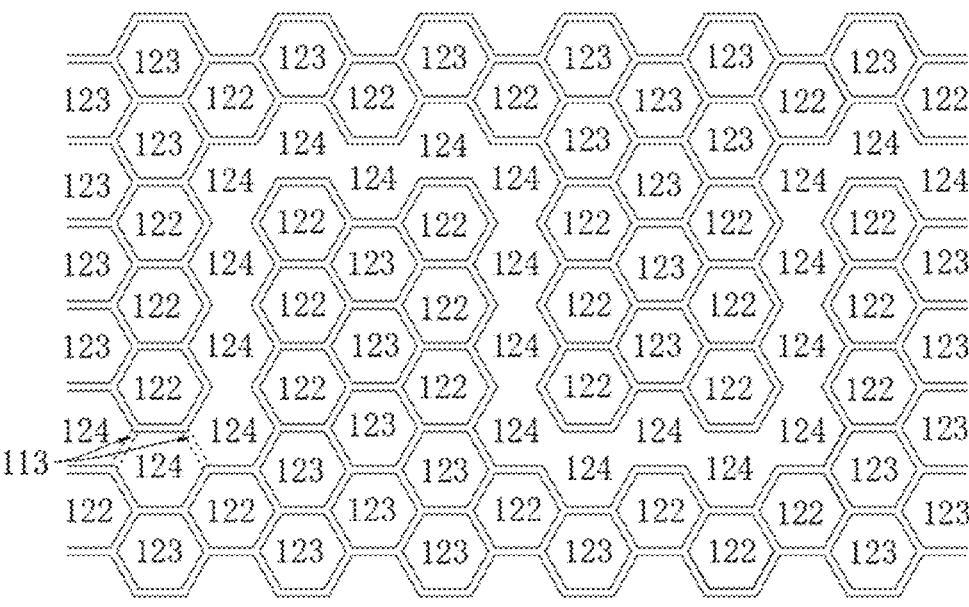
FIG. 15 is a schematic diagram of a touch electrode layer of a hexagonal mesh unit structure according to an implementation of this application.

In a possible implementation, as shown in FIG. 15, the mesh units 120 shown in this implementation are hexagonal. The fractures 111 provided on the touch film may include second fractures 113.

Both ends of each second fracture 113 are separately adjacent to at least two side metal lines of a first mesh unit 122. In this implementation, as shown in FIG. 15, after the entire metal mesh is deposited, the metal lines at positions indicated by double dashed lines in FIG. 15 are etched off, to form the second fractures 113 in this implementation. A conduction direction of the second fracture 113 is communicated with the third mesh units 124 on two sides, to form a separation capacitor structure between the transmit electrode 130 and the receive electrode 140.

In a possible implementation, as shown in FIG. 5, the transmit electrode 130 includes a plurality of transmit modules 131, and the receive electrode 140 includes a plurality of receive modules 141. At least some of the transmit modules 131 and at least some of the receive modules 141 are disposed in a staggered manner. There is a receive module 141 between at least some pairs of adjacent transmit modules 131.

Figure 16:
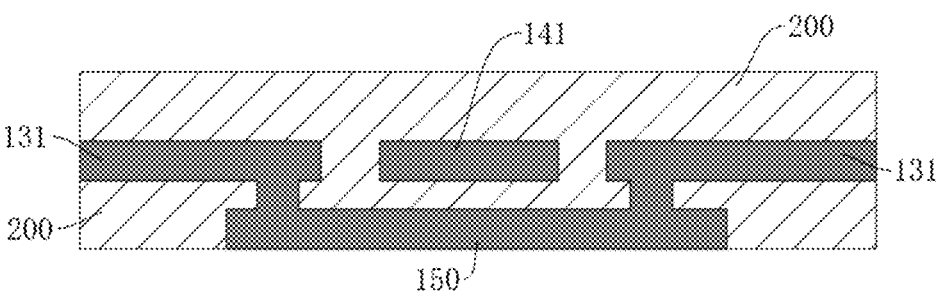
FIG. 16 is a schematic diagram of a connection between a first metal bridge and a transmit electrode according to an implementation of this application.

FIG. 16 is a schematic diagram of a connection between a first metal bridge and a transmit electrode. An upper part is a touch film layer. The touch film layer includes a touch electrode layer 100 and a dielectric isolation layer 200. The touch electrode layer 100 includes a transmit electrode 130 and a receive electrode 140. The transmit electrode 130 and the receive electrode 140 are electrically isolated from each other, to form a touch capacitor structure.

As shown in FIG. 16, two adjacent transmit modules 131 are separated by one receive module 141. The touch electrode layer 100 includes a first metal bridge 150, and the first metal bridge 150 is electrically connected to at least two transmit modules 131. In this implementation, that the first metal bridge 150 electrically connects two transmit modules 131 is used as an example. The first metal bridge 150 may also electrically connect three or more transmit modules 131 by extending a length of the first metal bridge 150. It should be noted that, for an entire screen, the touch electrode layer 100 of a touch film of the screen is divided into a plurality of transmit modules 131 and a plurality of receive module 141. The plurality of transmit modules 131 are electrically connected to form a whole, and the plurality of receive modules 141 are electrically connected to form a whole.

Specifically, some receive modules 141 are each located between two adjacent transmit modules 131. The first metal bridge 150 spans one side of the receive module 141 and is electrically connected to the two adjacent transmit modules 131. The first metal bridge 150 may span a bottom side of the receive module 141 in the middle.

The two adjacent transmit modules 131 are electrically connected through the first metal bridge 150. The receive module 141 located between the two adjacent transmit modules 131 is electrically isolated from the first metal bridge 150. The first metal bridge 150 is not in contact with the receive module 141. Specifically, the dielectric isolation layer 200 may be filled between the first metal bridge 150 and the receive module 141.

In a possible implementation, as shown in FIG. 5, the transmit electrode 130 includes a plurality of transmit modules 131, and the receive electrode 140 includes a plurality of receive modules 141. At least some of the transmit modules 131 and at least some of the receive modules 141 are disposed in a staggered manner. There is a receive module 141 between at least some pairs of adjacent transmit modules 131.

Figure 17:
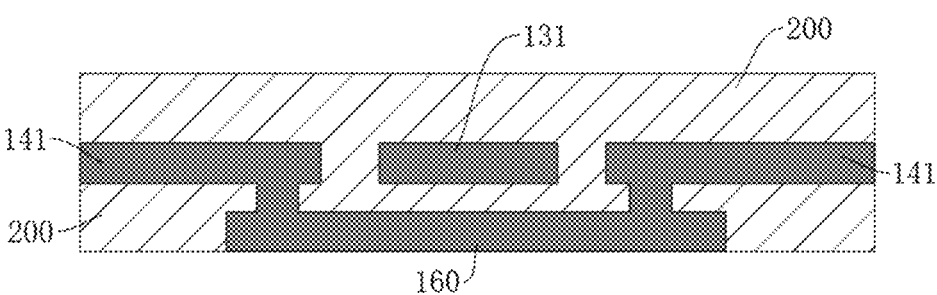
FIG. 17 is a schematic diagram of a connection between a second metal bridge and a receive electrode according to an implementation of this application.

FIG. 17 is a schematic diagram of a connection between a second metal bridge and a receive electrode. An upper part is a touch film layer. The touch film layer includes a touch electrode layer 100 and a dielectric isolation layer 200. The touch electrode layer 100 includes a transmit electrode 130 and a receive electrode 140. The transmit electrode 130 and the receive electrode 140 are electrically isolated from each other, to form a touch capacitor structure.

As shown in FIG. 17, two adjacent receive modules 141 are separated by one transmit module 131. The touch electrode layer 100 includes a second metal bridge 160, and the second metal bridge 160 electrically connects at least two receive modules 141. In this implementation, that the second metal bridge 160 electrically connects two receive modules 141 is used as an example. The second metal bridge 160 may also electrically connect three or more receive electrodes 140 by extending a length of the second metal bridge 160.

Specifically, some transmit modules 131 are each located between two adjacent receive modules 141. The second metal bridge 160 spans one side of the transmit module 131 and is electrically connected to the two adjacent receive modules 141. The second metal bridge 160 may span a bottom side of the transmit module 131 in the middle.

The two adjacent receive modules 141 are electrically connected through the second metal bridge 160. The transmit module 131 located between the two adjacent receive modules 141 is electrically isolated from the second metal bridge 160. The second metal bridge 160 is not in contact with the transmit module 131. Specifically, the dielectric isolation layer 200 may be filled between the second metal bridge 160 and the transmit module 131.

In a possible implementation, as shown in FIG. 5, the transmit electrode 130 includes a plurality of transmit modules 131, and the receive electrode 140 includes a plurality of receive modules 141. At least some of the transmit modules 131 and at least some of the receive modules 141 are disposed in a staggered manner. There is a receive module 141 between at least some pairs of adjacent transmit modules 131.

Figure 18:
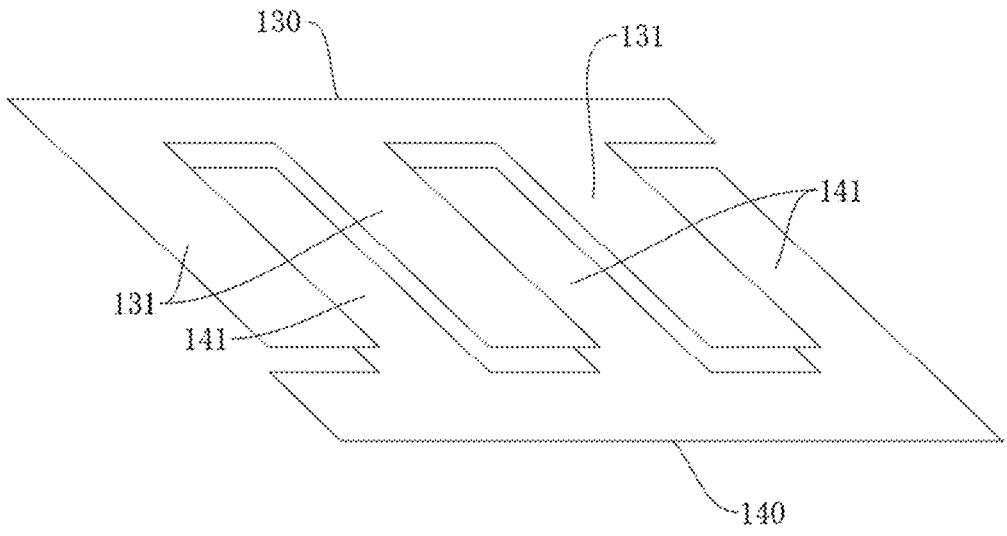
FIG. 18 is a schematic diagram of a double-layer structure of a transmit electrode and a receive electrode according to an implementation of this application.

As shown in FIG. 18, in this implementation, the transmit electrode 130 and the receive electrode 140 are not in a same layer in the dielectric isolation layer 200. The transmit electrode 130 and the receive electrode 140 are of a double-layer structure. The fractures 111 are located between layers at which the transmit electrode 130 and the receive electrode 140 are located.

Figure 19:
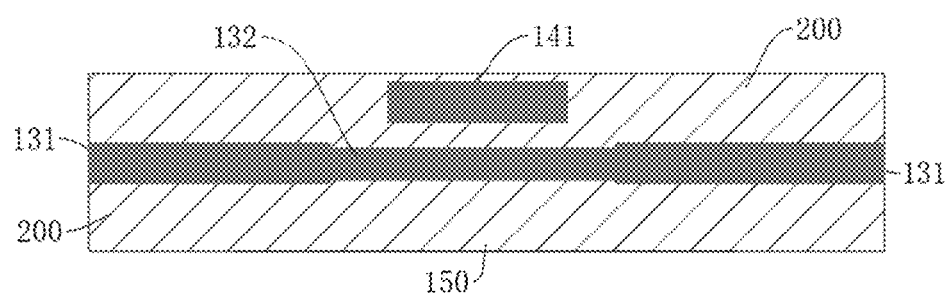
FIG. 19 is a schematic diagram of a first connection electrode according to an implementation of this application.

Specifically, as shown in FIG. 19, the touch electrode layer 100 includes a first connection electrode 132. The first connection electrode 132 electrically connects at least two transmit modules 131. In this implementation, an example in which the first connection electrode 132 electrically connects two transmit modules 131 is used. The first connection electrode 132 and the transmit electrode 130 are located at a same layer.

Figure 20:
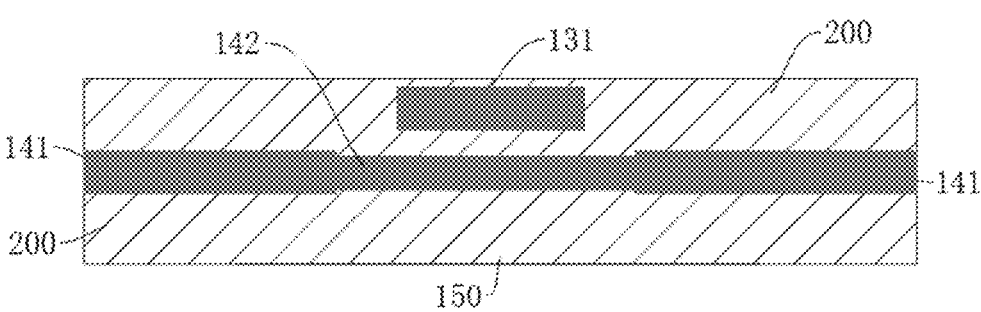
FIG. 20 is a schematic diagram of a second connection electrode according to an implementation of this application.

Specifically, as shown in FIG. 20, the touch electrode layer 100 includes a second connection electrode 142. The second connection electrode 142 electrically connects at least two receive modules 141. In this implementation, an example in which the second connection electrode 142 electrically connects two receive modules 141 is used. The second connection electrode 142 and the receive electrode 140 are located at a same layer.

Figure 21:
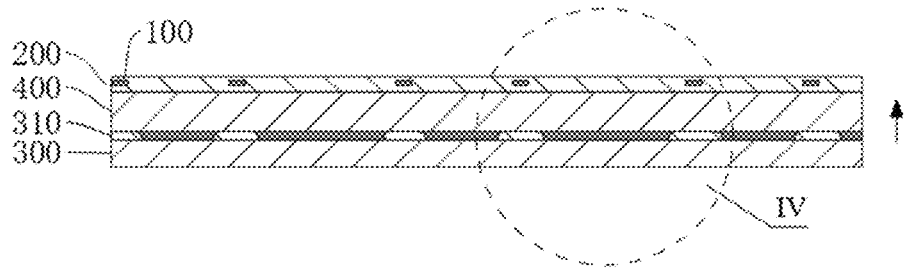
FIG. 21 is a schematic sectional view of a touchscreen according to an implementation of this application.

This application further provides a touchscreen. FIG. 21 is a schematic sectional view of the touchscreen. The touchscreen includes a light-emitting layer 300, a packaging layer 400, and the touch film described in any one of the foregoing implementations. The light-emitting layer 300, the packaging layer 400, and the touch film are sequentially stacked. The touch film includes a touch electrode layer 100 and a dielectric isolation layer 200. The dielectric isolation layer 200 is attached to the packaging layer 400. The touch electrode layer 100 is located in the dielectric isolation layer 200.

Figure 22:
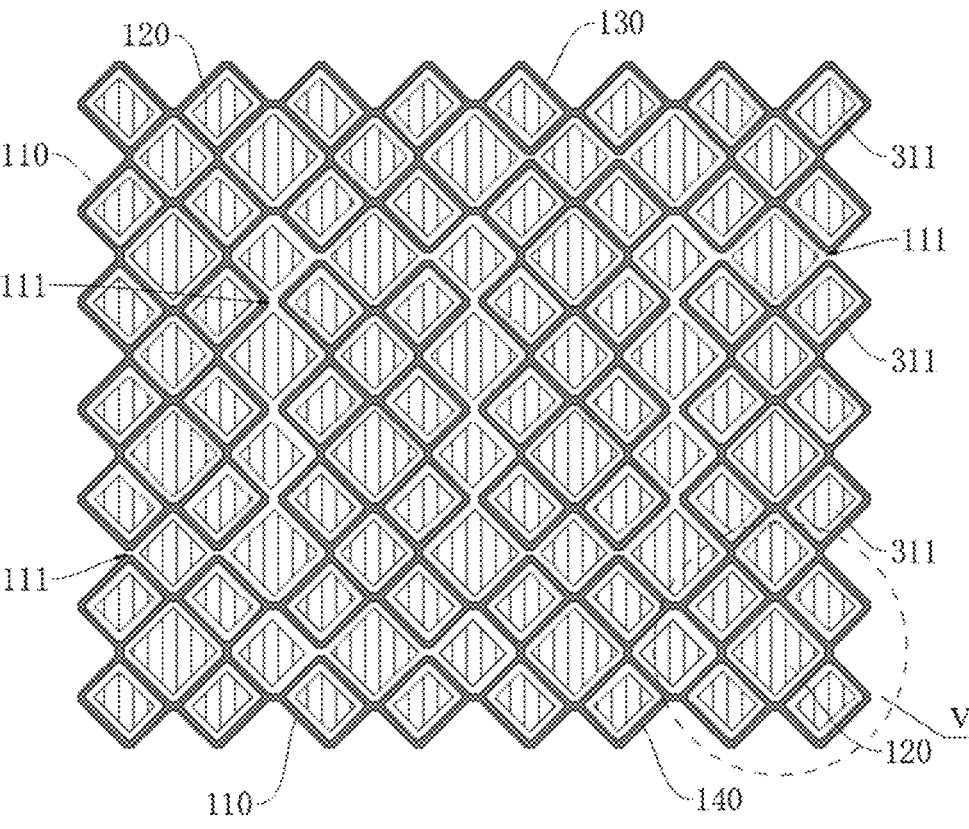
FIG. 22 is a relative schematic diagram of a touch electrode layer and pixels according to an implementation of this application.

The light-emitting layer 300 may be an OLED flexible light-emitting layer, and includes a pixel definition layer 310. There are a plurality of pixels 311 on the pixel definition layer 310. FIG. 22 is a relative schematic diagram of a touch electrode layer and pixels.

The pixels 311 are in a one-to-one correspondence with a plurality of mesh units 120 in the touch electrode layer 100 in a light-emitting direction of the light-emitting layer 300. Specifically, the light-emitting direction of the light-emitting layer 300 is a direction indicated by an arrow in FIG. 17. Light emitted by each pixel 311 diverges outward through a mesh unit 120 corresponding to the pixel 311. Different mesh units 120 correspond to pixels 311 of a same color or different colors.

According to the touchscreen in this implementation, the touch film is packaged and integrated on the light-emitting layer 300 by using a thin film, and the packaging layer 400 and the touch film are disposed on the OLED flexible light-emitting layer, to form a flexible touchscreen that can be bent reciprocally. In addition, a transmit electrode 130 and a receive electrode 140 of the touch electrode layer 100 in the touch film are provided with fractures 111 at vertex angles of the mesh units 120, and formed touch capacitor structures are located at the vertex angles of the mesh units. When the touchscreen is subject to an external pressing force or is bent, a stress value at positions of the fractures 111 is correspondingly reduced, and the dielectric isolation layer filled in the fractures 111 can withstand a greater stress without deformation. This improves structural strength of the touchscreen, and prolongs a service life of the flexible touchscreen.

Figure 23:
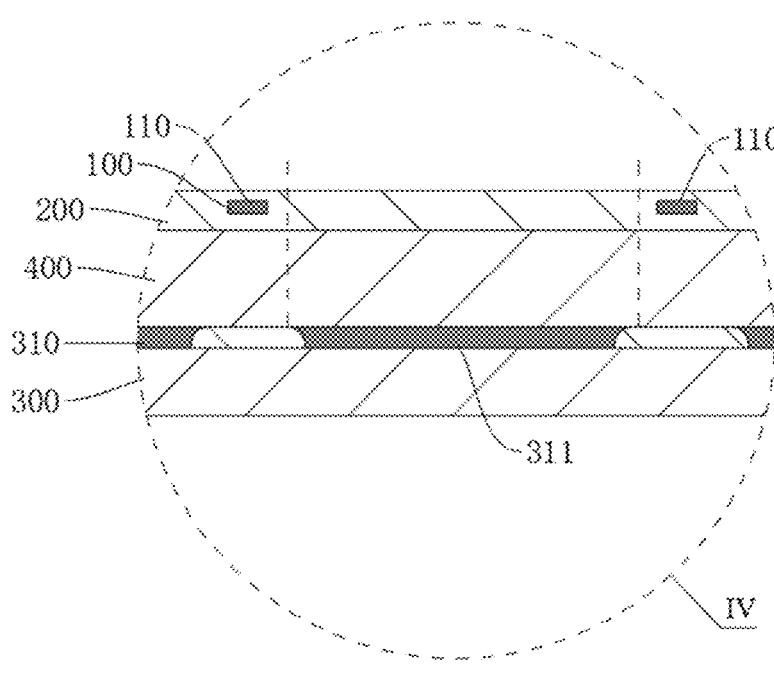
FIG. 23 is an enlarged diagram of a part IV in FIG. 21 according to this application.

In a possible implementation, as shown in FIG. 22 and FIG. 23, FIG. 23 is an enlarged diagram of a part IV in FIG. 21, and a projection of each pixel 311 on the touch electrode layer 100 in the light-emitting direction (refer to the direction indicated by the arrow in FIG. 23) of the light-emitting layer 300 falls within a mesh unit 120 corresponding to the pixel 311.

As shown in FIG. 23, a projection of a pixel 311 in the light-emitting direction of the light-emitting layer 300 on a plane on which the touch electrode layer 100 is located is a region between two dashed lines. A part between two metal lines 110 shown in FIG. 23 corresponds to one mesh unit 120. There is a gap between the projection of the pixel 311 on the plane on which the touch electrode layer 100 is located and each metal line 110, so that light emitted by the pixel 311 in the light-emitting direction passes through the mesh unit 120 without being blocked by the metal lines 110.

Figure 24:
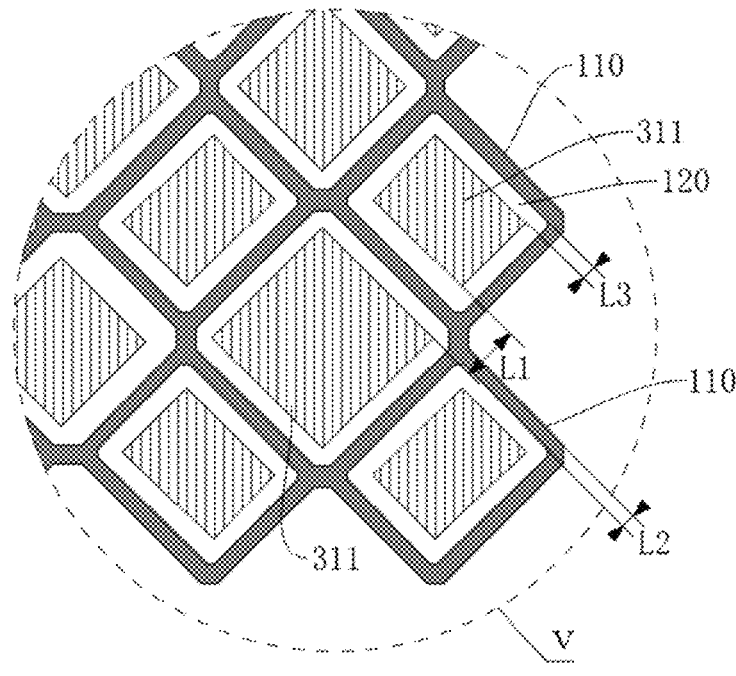
FIG. 24 is an enlarged diagram of a part V in FIG. 22 according to this application.

Specifically, a spacing between two adjacent pixels 311 is greater than a width of the metal line 110. FIG. 24 is an enlarged diagram of a part V in FIG. 22. The spacing between two adjacent pixels 311 is L1, the width of the metal line 110 is L2, and a value of the spacing L1 is greater than a value of the width L2. Therefore, when the touchscreen is compared from a top view, there is a spacing between edges of each pixel 311 and the metal lines 110 around the pixel 311, and an area of the pixel 311 is less than an area of the mesh unit 120.

Specifically, a first plane is a plane perpendicular to the light-emitting direction of the light-emitting layer 300. For example, a plane in which graphics in FIG. 22 and FIG. 24 are located is the first plane. Along the first plane, a spacing between the metal line 110 and the edge of the pixel 311 is within a range of 1 micrometer to 10 micrometers, to ensure that the light emitted by the pixel 311 can pass through the mesh unit 120 to a large extent without being blocked by the metal line 110.

For example, on the plane shown in FIG. 24, a spacing between the metal line 110 and the edge of the pixel 311 is a vertical distance between a point on the edge of the pixel 311 and an edge of the metal line 110, for example, a distance L3 shown in FIG. 24. In an actual touchscreen product, the spacing is a vertical distance between a point on an edge of the projection of the pixel 311 in the light-emitting direction on the first plane and the edge of the metal line 110.

This application further provides an electronic device, including a display screen. The display screen includes the touchscreen described in any one of the foregoing implementations. The electronic device may be a terminal device such as a mobile phone, a tablet computer, or a PC. A main application scenario of the electronic device described in this application is to reduce a probability of a touch failure of a screen in a process of bending and using the device. For example, as shown in FIG. 1 and FIG. 2, the electronic device may be a foldable mobile phone, the foldable mobile phone includes the display screen, and the display screen is a flexible foldable display screen.

In this application, electrode fractures of a touch film in the electronic device are provided at vertex angles of mesh units. When a touchscreen of a bent part of the foldable mobile phone is bent, a stress concentration factor at positions of the fractures is effectively reduced, so that a possibility of a fracture at a dielectric isolation layer of the touchscreen due to a stress concentration is reduced. This reduces a probability of a failure of a touch function and the screen, and prolongs a service life of the display screen.

The foregoing embodiments are merely intended to describe the technical solutions of this application, but not to limit this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of embodiments of this application, all of which shall fall within the protection scope of this application.

What is claimed is:

1. An electronic device, comprises a touchscreen, wherein the touchscreen comprises a light-emitting layer, a packaging layer, and a touch film, wherein the touch film, the packaging layer, and the light-emitting layer are sequentially stacked, wherein the touch film comprises a touch electrode layer and a dielectric isolation layer, wherein the touch electrode layer is located in the dielectric isolation layer, the touch electrode layer comprises metal lines arranged in a cross manner to form a plurality of mesh units;

fractures are provided on the metal lines, the fractures are configured to divide the metal lines into a transmit electrode and a receive electrode, and the transmit electrode and the receive electrode form a touch capacitor structure at each fracture of the fractures, wherein the fractures comprise first fractures, each of the first fractures is located between opposite vertex angles of at least two diagonally adjacent mesh units; and a first direction is perpendicular to a conduction direction of each fracture of the fractures, each of two ends of a corresponding fracture in the first direction is adjacent to two sides of at least one of the mesh units and is adjacent to the vertex angles, and the corresponding fracture is configured to electrically isolate mesh units on two sides in the conduction direction of the corresponding fracture.

2. The electronic device according to claim 1, wherein a width of a corresponding first fracture of the first fractures in the first direction is within a range of 1 micrometer to 10 micrometers.

3. The electronic device according to claim 1, wherein the mesh units comprise first mesh units, the first mesh units are located at an edge of at least one of the transmit electrode or the receive electrode, and at least one vertex angle of each of the first mesh units is adjacent to the fractures.

4. The electronic device according to claim 1, wherein the mesh units comprise second mesh units, and side metal lines of the second mesh units are isolated from the fractures.

5. The electronic device according to claim 1, wherein the mesh units comprise third mesh units, the third mesh units are communicated with the fractures, and adjacent third mesh units are communicably coupled to each other.

6. The electronic device according to claim 1, wherein the transmit electrode comprises transmit modules, the receive electrode comprises receive modules, one or more of the transmit modules and one or more of the receive modules are disposed in a staggered manner, a receive module is disposed between one or more pairs of adjacent transmit modules, the touch electrode layer comprises a first metal bridge, and the first metal bridge electrically connects at least two of the transmit modules.

7. The electronic device according to claim 6, wherein the first metal bridge spans one side of the receive module and is electrically connected to the adjacent transmit modules, and the receive module between the adjacent transmit modules is electrically isolated from the first metal bridge.

8. The electronic device according to claim 1, wherein the transmit electrode comprises a plurality of transmit modules, the receive electrode comprises a plurality of receive modules, one or more of the transmit modules and one or more of the receive modules are disposed in a staggered manner, a transmit module between one or more pairs of adjacent receive modules, the touch electrode layer comprises a second metal bridge, and the second metal bridge electrically connects one or more of the receive modules.

9. The electronic device according to claim 8, wherein the second metal bridge spans one side of the transmit module and is electrically connected to the adjacent receive modules, and the transmit module between the adjacent receive modules is electrically isolated from the second metal bridge.

10. The electronic device according to claim 1, wherein the transmit electrode and the receive electrode are in different layers in the dielectric isolation layer.

11. The electronic device according to claim 10, wherein the touch electrode layer comprises a first connection electrode, the transmit electrode comprises transmit modules, the first connection electrode electrically connects at least two of the transmit modules, and the first connection electrode and the transmit electrode are located at a same layer.

12. The electronic device according to claim 10, wherein the touch electrode layer comprises a second connection electrode, the receive electrode comprises receive modules, the second connection electrode electrically connects at least two of the receive modules, and the second connection electrode and the receive electrode are located at a same layer.

13. The electronic device according to claim 1, wherein the light-emitting layer comprises a pixel definition layer, the pixel definition layer comprises a plurality of pixels, the plurality of pixels are arranged in a matrix manner, and the plurality of pixels are in a one-to-one correspondence with a plurality of mesh units in a light-emitting direction of the light-emitting layer.

14. The electronic device according to claim 1, wherein a projection of each pixel on a touch electrode layer in the light-emitting direction of the light-emitting layer falls within a mesh unit corresponding to the pixel, and a gap exists between a side metal line of the mesh unit and the projection that falls within the mesh unit.

15. The electronic device according to claim 1, wherein a spacing between adjacent pixels is greater than a width of a metal line of the metal lines.

16. The electronic device according to claim 1, wherein a first plane is perpendicular to the light-emitting direction of the light-emitting layer, and a spacing between the metal line and an edge of a pixel is within a range of 1 micrometer to 10 micrometers along the first plane.

17. The electronic device according to claim 1, wherein the light-emitting layer comprises an OLED light-emitting layer.

18. The electronic device according to claim 1, wherein the electronic device comprises a foldable mobile phone, the foldable mobile phone comprises a display screen, and the display screen is a flexible foldable display screen.

19. The electronic device according to claim 1, wherein the transmit electrode comprises transmit modules, the receive electrode comprises receive modules, one or more of the transmit modules and one or more of the receive modules are disposed in a staggered manner, a receive module is disposed between one or more pairs of adjacent transmit modules, the touch electrode layer comprises a first metal bridge, and the first metal bridge electrically connects at least two of the transmit modules.

* * * * *